US005610686A

United States Patent [19]
Osanai

[11] Patent Number: 5,610,686
[45] Date of Patent: Mar. 11, 1997

[54] EXPOSURE APPARATUS INCLUDING AN ANTIVIBRATION CONTROL SYSTEM

[75] Inventor: Eiji Osanai, Yokohama, Japan

[73] Assignee: Canon Kabushiki Kaisha, Tokyo, Japan

[21] Appl. No.: 404,312

[22] Filed: Mar. 15, 1995

[30] Foreign Application Priority Data

Mar. 15, 1994 [JP] Japan .................................... 6-068960

[51] Int. Cl.⁶ ......................... H01L 21/30; G03B 27/58
[52] U.S. Cl. ............................................. 355/72; 355/53
[58] Field of Search ........................... 355/53, 72, 73

[56] References Cited

U.S. PATENT DOCUMENTS

| | | | |
|---|---|---|---|
| 4,473,292 | 9/1984 | Mayer | 355/53 |
| 5,040,431 | 8/1991 | Sakino et al. | 74/479 |
| 5,155,523 | 10/1992 | Hara et al. | 355/53 |
| 5,172,160 | 12/1992 | Van Eijk et al. | 355/53 |
| 5,187,519 | 2/1993 | Takabayashi et al. | 355/53 |
| 5,280,677 | 1/1994 | Kubo et al. | 33/568 |
| 5,376,988 | 12/1994 | Osanai | 355/53 |
| 5,446,519 | 8/1995 | Makinouchi | 355/53 |

*Primary Examiner*—Arthur T. Grimley
*Assistant Examiner*—David A. Lane
*Attorney, Agent, or Firm*—Fitzpatrick, Cella, Harper & Scinto

[57] ABSTRACT

An exposure apparatus includes an exposure optical system, a stage on which an article to be exposed is to be placed, a moving mechanism for moving the stage relative to the exposure optical system, a first base for supporting the moving mechanism, a main base for supporting the exposure optical system, on which main base the first base is mounted, a first supporting portion being interposed between the first base and the main base, a second base for supporting the main base, a vibration removing device being interposed between the main base and the second base, and a second supporting portion being interposed between the first base and the second base.

10 Claims, 7 Drawing Sheets

EXPOSURE APPARATUS INCLUDING AN ANTIVIBRATION CONTROL SYSTEM

FIELD OF THE INVENTION AND RELATED ART

This invention relates to an exposure apparatus usable for the manufacture of semiconductor devices and, more particularly, to an exposure apparatus having an improved supporting structure for a stage on which a substrate such as a semiconductor wafer is to be placed.

As for the exposure apparatuses for manufacture of semiconductor devices, there is one which is called a stepper. In such a stepper, while a substrate such as a semiconductor wafer is moved stepwise below a projection lens, an image of a pattern formed on an original such as a reticle is projected onto the wafer in a reduced scale, such that the pattern images are printed sequentially on different regions on one wafer. Regarding performance such as resolution and registration precision, the stepper is considered be the primary achiever of the exposure apparatuses.

Figure 8:
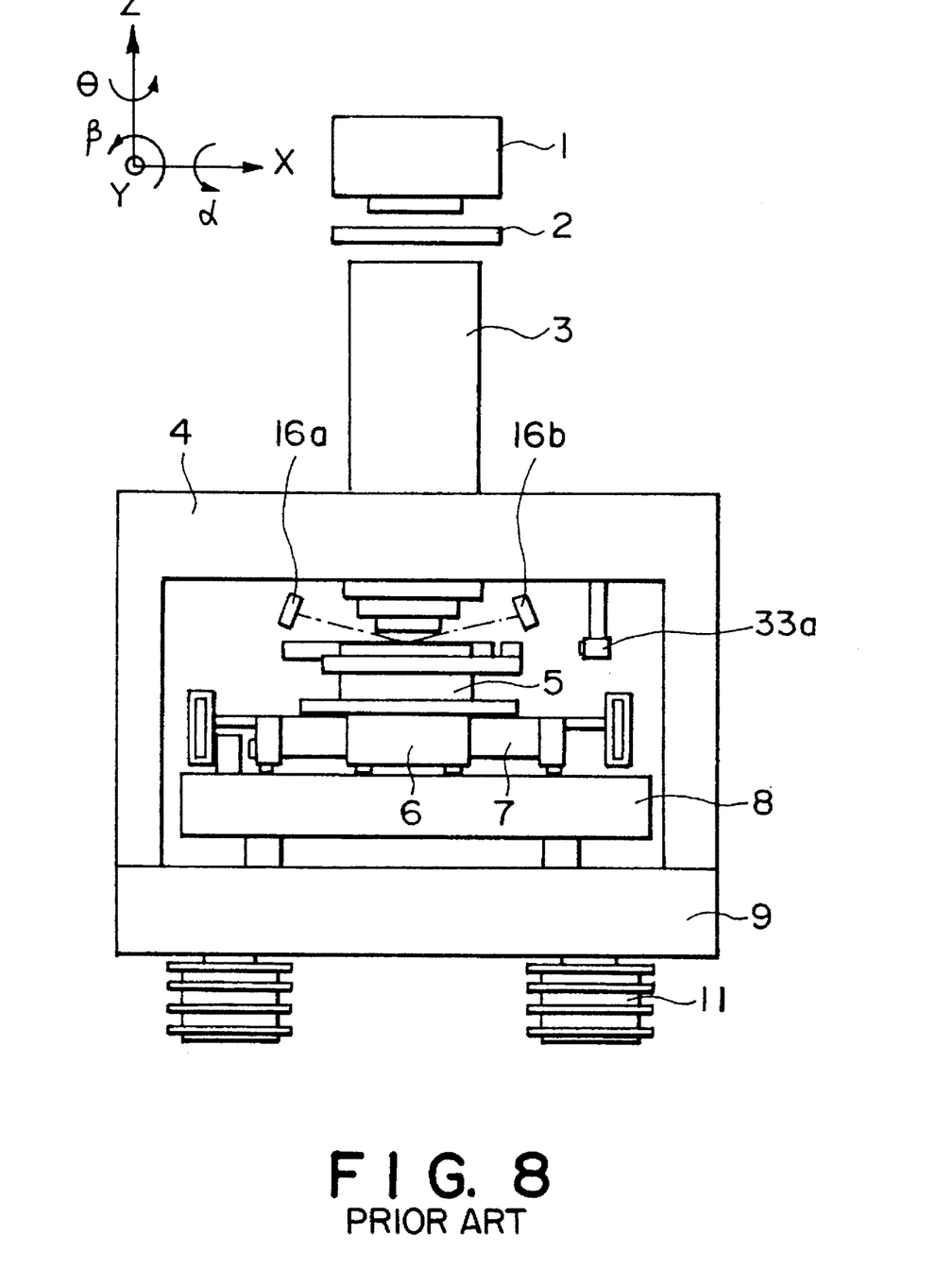
FIG. 8 is a front elevational view of a known type exposure apparatus.

FIG. 8 is a front view, illustrating a main structure and a wafer stage of a known type exposure apparatus.

Denoted in this drawing at 1 is illuminating means for illuminating a reticle pattern, and denoted at 2 is a reticle having a pattern to be transferred. Denoted at 3 is a projection lens for projecting the pattern, formed on the reticle 2, onto a wafer, and denoted at 4 is a barrel support for supporting the projection lens 3. Denoted at 5 is a top stage on which a wafer (not shown) is to be placed, and it is movable in the θ and Z directions as well as in the α and β directions. Denoted at 6 is an X-Y stage on which the top stage 5 is mounted. The X-Y stage 6 is movable in the X and Y directions. Denoted at 8 is a stage base having a top guiding surface, and it serves to support the X-Y stage 6 and a movable guide 7 with respect to the Z direction, without contact thereto through static air bearing means. Denoted at 9 is a base for fixedly supporting the stage base 8, and the barrel support 4 is integrally coupled to the base 9. Denoted at 11 are air mounts, disposed at four locations, for supporting the base 9. Denoted at 33a is a laser interferometer for measuring the relative position of the projection lens 3 and the X-Y stage 6, and denoted at 16a is a light projecting means of a focus detecting means, for measuring the distance between the focal point position of the projections lens 3 and the top surface of the wafer. Denoted at 16b is the light receiving means of the focus detecting means.

As regards semiconductor wafers which are to be processed in an exposure apparatus of such structure, there is a tendency of using wafers of larger diameter or larger size so as to meet increases in area of each semiconductor chip and to meet reduction in cost. Also, because of an increasing degree of integrate on of each semiconductor chip, higher speed and higher precision wafer stages as well as higher alignment precision and higher throughput are desired.

In such exposure apparatuses, however, in order to meet the increasing diameter of a semiconductor wafer to be used and to meet the requirement of higher speed and higher precision of the X-Y stage, the dynamic characteristics of the X-Y stage 6 should be improved. To this end, the guide rigidity, for example, has to be increased. Thus, the stage weight necessarily becomes larger, in addition to the increase in weight of the stage due to the increase in its stroke. Further, if, for enhanced throughput, the movement acceleration and movement speed of the X-Y stage are increased so as to reduce the movement time period, the vibratory force due to acceleration of the stage movement becomes larger. In combination with the relative decrease in rigidity of the structural members such as a lens holding member resulting from the increase in weight of the projection lens 3, in the known example such as described above, the following problems arise:

(1) Enlargement in size of the apparatus and increase in cost, due to the reinforcement of the structure:

(2) Due to an increase of the vibratory force intrinsic vibration exists in the whole apparatus supported by an anti-vibration mount 11 or in the mechanism mounted in the apparatus. This results in transmission of external forces to the wafer stage 5 or the laser interferometer 33a, and thus high speed and high precision positioning operation are affected.

SUMMARY OF THE INVENTION

It is an object of the present invention to assure that, in an exposure apparatus, transmission of vibration is prevented and high speed and high precision positioning operations are both accomplished with a simple structure.

In accordance with an aspect of the present invention, there is provided an exposure apparatus, comprising: an exposure optical system; a stage on which an article to be exposed is to be placed; moving means for moving said stage relative to said exposure optical system; a first base for supporting said moving means; a main base for supporting said exposure optical system, on which main base said first base is mounted; first supporting means being interposed between said first base and said main base; a second base for supporting said main base; vibration removing means being interposed between said main base and said second base; and second supporting means being interposed between said first base and said second base.

The first supporting means may serve to support said first base relative to said main base with respect to a direction of an optical axis of said exposure optical system, and said second supporting means may serve to support said first base relative to said second base with respect to a direction perpendicular to the optical axis.

The first supporting means may include static fluid bearing means.

The second supporting means may include a supporting member for resiliently supporting said first base.

The second supporting means may include a supporting member for resiliently supporting said first base, and driving means for driving said first base.

The driving means may be disposed so as to cancel an inertial force in a direction perpendicular to the optical axis of said exposure optical system which force is to be transmitted to said first base with the movement of said moving means.

The driving means may serve to control and reduce relative displacement of said first base relative to said main base, in accordance with the movement direction of said moving means.

The vibration removing means may include a mount member for resiliently supporting said main base.

In the structure described above, as a wafer stage is moved, a large inertial force is produced in the movement direction, which force is transmitted to the first base. However, since the first base is supported by the main base and through the first supporting means, while it is supported by the second base through the second supporting means and since the main base is supported by the second base through the vibration removing means, the inertial force in the supporting direction of the first base by the second supporting means is absorbed by the second base and, additionally, vibration transmission between the second base and the main base is blocked by the vibration removing means. As a result, the inertial force in the supporting direction due to the acceleration or deceleration of the wafer stage is not transmitted To the main base. Therefore, high speed and high precision positioning of the wafer stage relative to the exposure optical system or the like are assured.

The first base may be supported by the main base through static bearing means with respect to the Z direction (the direction) of an optical axis of the exposure optical system), α direction (rotational direction about the X axis), and β direction (rotational direction about the Y axis), and also it may be supported by the second base, being vibration isolated from the main base by the vibration removing means, through air cushion means or a linear motor means with respect to the X direction (direction perpendicular to the Z axis), Y direction (direction perpendicular to the X and Z axes) and θ direction (rotational direction about the Z axis). On that occasion, there is no possibility of transmission of a large inertial force due to acceleration or deceleration of the wafer stage to the main base. Therefore, (1) enlargement in size of the apparatus due to reinforcement of the structure is not necessary, and the cost can be reduced easily; and (2) regardless of an increase in vibratory force, excitement of intrinsic vibration in the whole apparatus or in the mechanism mounted on the apparatus is prevented. Consequently, transmission of external disturbance vibration to the wafer stage or the laser interferometer is avoided and, thus, high speed and high precision positioning operation of the wafer stage are accomplished.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
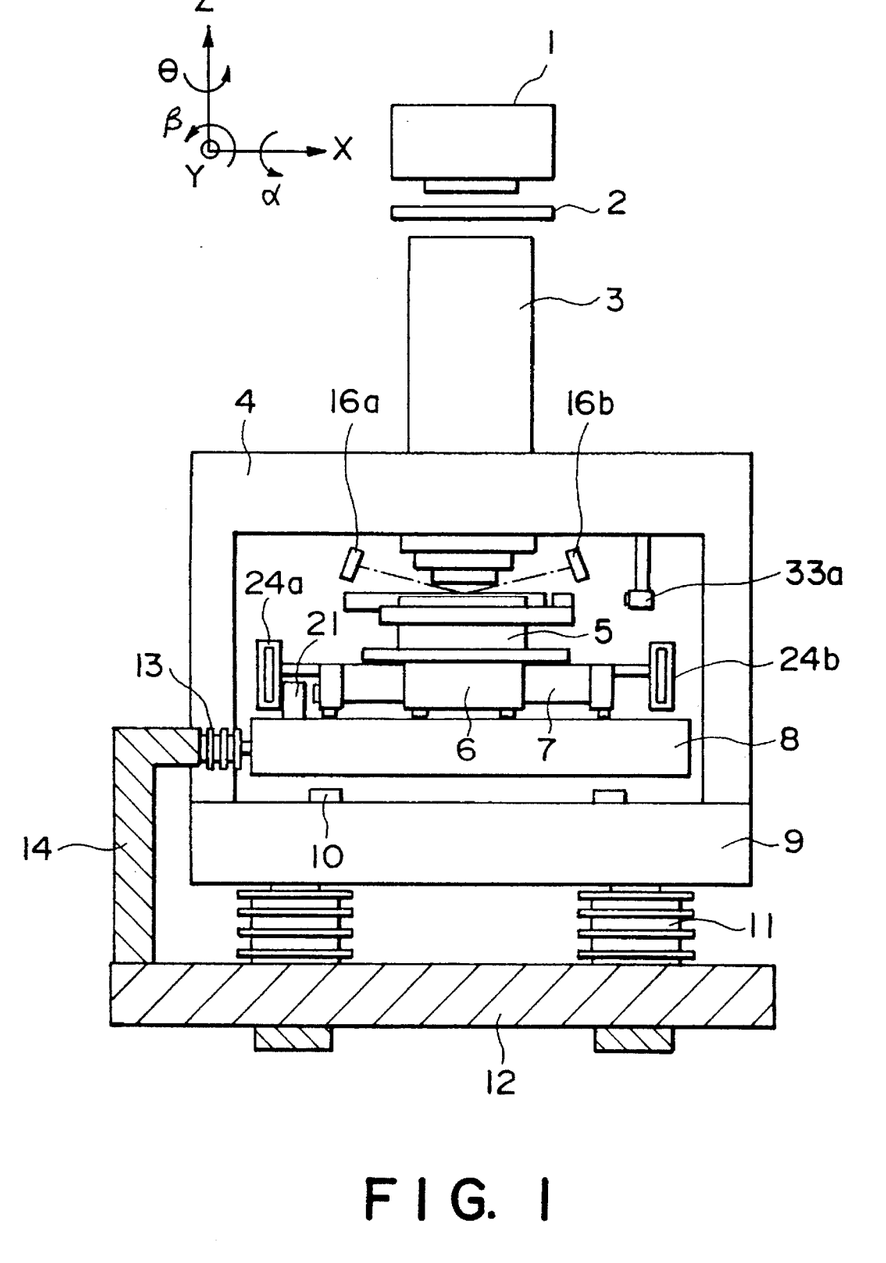
FIG. 1 is a front elevational view of an exposure apparatus according to a first embodiment of the present invention.
Figure 2:
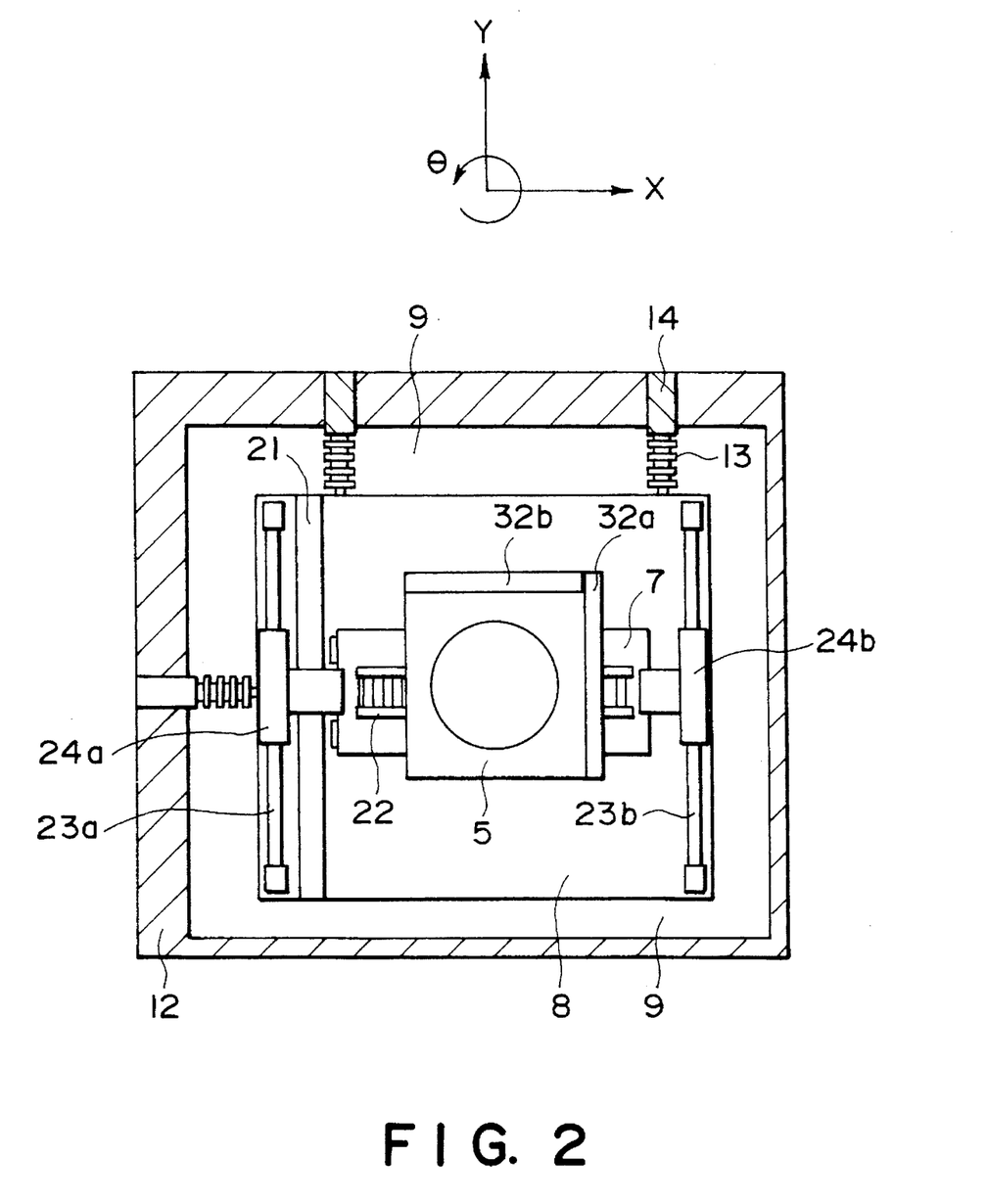
FIG. 2 is a top plan view of a wafer supporting stage of the exposure apparatus of FIG. 1.

FIG. 1 is a front elevational view of an exposure apparatus according to a first embodiment of the present invention, best showing the features of the present invention. FIG. 2 is a top plan view of the stage portion of the apparatus of FIG. 1.

Denoted in these drawings at 2 is a reticle having a pattern to be transferred. Denoted at 1 is an illuminating system for illuminating the reticle 2. Denoted at 3 is a projection lens for projecting the pattern formed on the reticle 2 onto 8 wafer, and denoted at 4 is a barrel support for supporting the projection lens. Denoted at 5 is a top stage on which a wafer (not shown) is to be placed. The top stage has a function of moving in the θ and Z directions as well as in the α and β directions. Denoted at 6 is an X-Y stage on which the top stage 5 is mounted. The X-Y stage 6 is movable in the X and Y directions. Denoted at 7 is a movable guide for supporting the X-Y stage 6 in the Y direction without contact thereto through static air bearing means, and for guiding movement of the X-Y stage in the X direction. Denoted at 8 is a stage base having a top guiding surface, for supporting the X-Y stage 6 and the movable guide 7 in the Z direction without contact thereto through static air bearing means. Denoted at 21 is a yaw guide which is mounted integrally to the stage base 8. The yaw guide 21 serves to support the movable guide 7 in the X direction without contact thereto through air bearing means and to guide movement of the movable guide 7 in the Y direction. Denoted at 22 is a stator Of a linear motor for driving the X-Y stage 6 in the X direction. It is fixed to the movable guide 7. A moving element of the motor is coupled to the X-Y stage 6. Denoted at 23a and 23b are stators of linear motors for driving the movable guide 7 in the Y direction, and these stators are fixedly mounted to the stage base 8 so that they are opposed to each other. Denoted at 24a and 24b are moving elements of the linear motors for driving the movable guide 7 in the Y direction, and these elements are mounted to the movable guide 7 so that they are opposed to each other. Denoted at 9 is a main base on which the stage base 8 is mounted. Denoted at 10 are static air pads for supporting the stage base 8, and these members are mounted on the main base 9. These static air pads 10 serve to define static air bearing means between the pads and the surface of the main base 8 opposed to the pads in response to supply of compressed air to the air pads. These air pads are disposed at at least three locations, so as to support the stage base 8 without contact thereto with respect to the Z direction and to the α and β directions. The main base 9 and the barrel support 4 ere integrally coupled to each other.

Denoted at 11 are air mounts disposed at four locations, for supporting the main base 9. Denoted at 12 is a base for supporting the whole structure of the apparatus through the air mounts 11. The air mounts 11 serve to isolate the main base 9 from vibration of the base 12. Denoted at 13 are air cushions which are provided at three locations on the stage base 8, for supporting the stage base in the X, Y and θ directions. Denoted at 14 is a coupling member for fixing the air cushions 13 to the base 12. These air cushion 13 have a minimized rigidity in the Z direction, such that they serve to isolate the stage base 8 from vibration of the base 12 in the Z direction. The rigidity of the air cushions 13 in the supporting directions (X, Y and θ directions) is adjusted so that the intrinsic vibration related to the supporting direction of the stage base 8 becomes not greater than about 20 Hz.

Denoted at 33a is a laser interferometer for measuring the relative position of the projection lens 3 and the X-Y stage 6. Denoted at 16a is a light projecting portion of focus detecting means, for measuring the distance between the focal point position of the projection lens 3 and the top surface of the wafer. Denoted at 16b is a light receiving portion of this focus detecting means. The light projecting portion 16a and the light receiving portion 16b are fixedly mounted to the projection lens 3.

Figure 3:
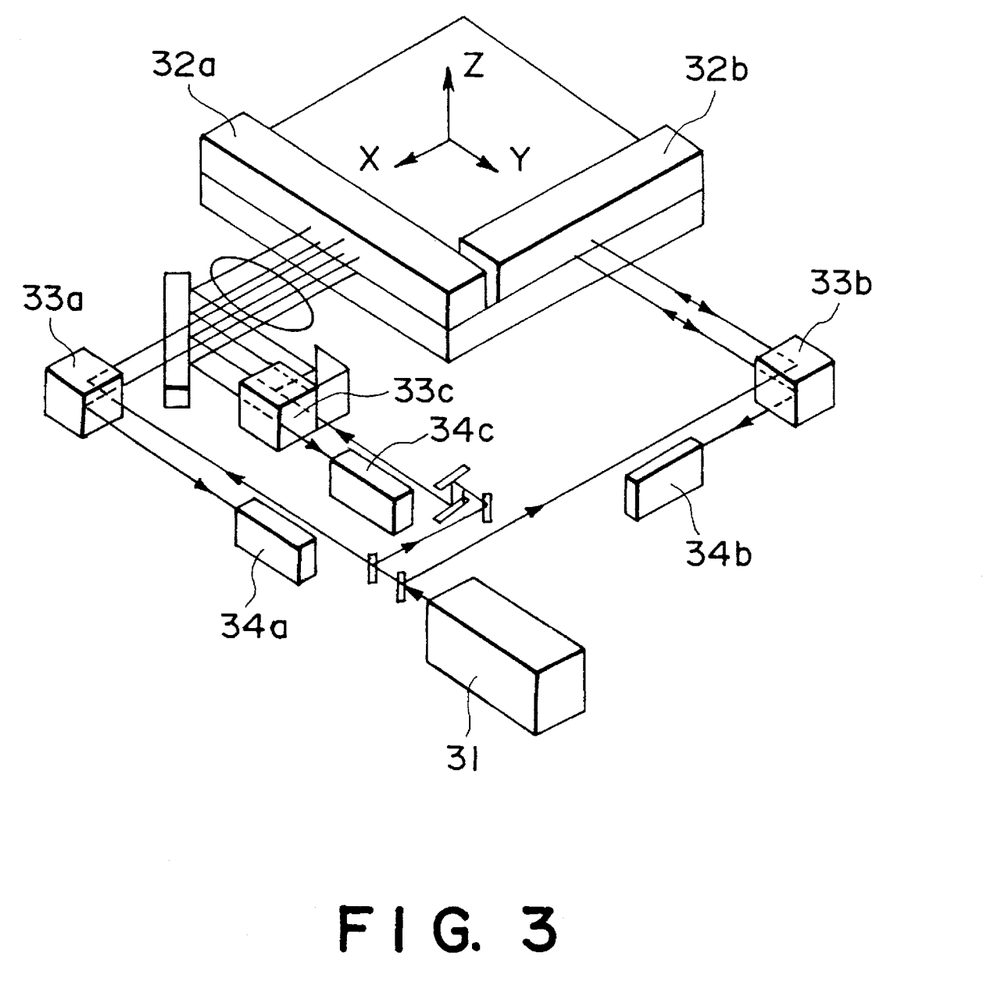
FIG. 3 is a perspective view for explaining the disposition of a measuring system of the exposure apparatus of FIG. 1.

FIG. 3 is a perspective view for explaining disposition of an X-Y stage measurement system (laser measurement system) of the exposure apparatus of this embodiment, and it illustrates details of the portion of the laser interferometer 33a of FIG. 1 around the top stage 5.

Denoted in FIG. 3 at 31 is a laser head (light source), and denoted at 32a and 32b are reflection mirrors which are mounted on the top stage 5 of FIG. 1. Denoted at 33a is an interferometer for measurement in the X direction, and denoted at 33b is another interferometer for measurement in the Y direction. Denoted at 33c is an interferometer for measuring yawing of the top stage 5, that is, for measurement in the θ direction about the optical axis of the projection lens. Denoted at 34a, 34b and 34c are receivers each for transforming an interference fringe into an electrical signal. The receiver 34a relates to the measurement in the X direction. The receiver 34b relates to the measurement in the Y direction, and the receiver 34c relates to the measurement in the θ direction.

In the structure described above, first a wafer (not shown) to be exposed is placed on the top stage 5, and drive signals are applied to the X-Y stage 6 and the top stage 5 from an external controller (not shown). In response, the wafer is moved to a predetermined position below the projection lens 3 and into a predetermined attitude. Here, errors of the wafer with respect to the desired position in the X, Y and Z directions as well as in the rotational directions (α, β and θ directions) about these axes are calculated by the external controller, on the basis of the outputs of the laser measurement systems and of the focus detecting system. The calculated errors are fed back to the respective driving means, whereby the wafer is controlled and positioned into the predetermined position and attitude. After one exposure is accomplished, the wafer is moved to the next position and the exposure operation is repeated.

Here, particularly the inertial forces due to the acceleration and deceleration of the X-Y stage in the X and Y directions act on, as reactive forces, the stage base 8. Among these reactive forces, those in the X, Y and θ directions are transmitted to the base 12 through the air cushions 13 and the coupling member 14 and are supported thereby. Thus, these forces are not transmitted to the main base 9. Moment reactive forces in the α and β directions are supported by the main frame 9 through the static air pads 10, but these reactive forces are very small as compared with the forces in the other directions.

As a result, intrinsic vibration of the mechanism systems of the apparatus supported by the air mounts 11 is not excited, and no disturbance vibration is transmitted to the laser measurement system and the focus detecting system. Although the supporting reactive forces transmitted to the base 12 may excite intrinsic vibration of the coupling member 14 and the base 12, the air mounts 11 block transmission of vibration to the main base 9. Further, the stage base 8 displaces relative to the main base 9 in the X, Y and θ directions at a frequency of about 20 Hz or lower, but this Ks met by moving the X-Y stage 6 and the top. stage 5.

As an important feature of this embodiment, large reactive forces (forces in the X, Y and θ directions) to be transmitted to the stage base 8 due to inertial forces produced in response to acceleration and deceleration of the X-Y stage 6 are supported by the base 12, and transmission of these reactive forces to the apparatus as a whole is blocked. This prevents excitement of intrinsic vibration of various mechanism systems in the apparatus which may cause disturbance of the laser measurement system and the focus detecting system. Also, transmission of vibration of not less than 20 Hz to the stage base 8 is blocked. As a result, high speed and high precision positioning operations are accomplished.

Figure 4:
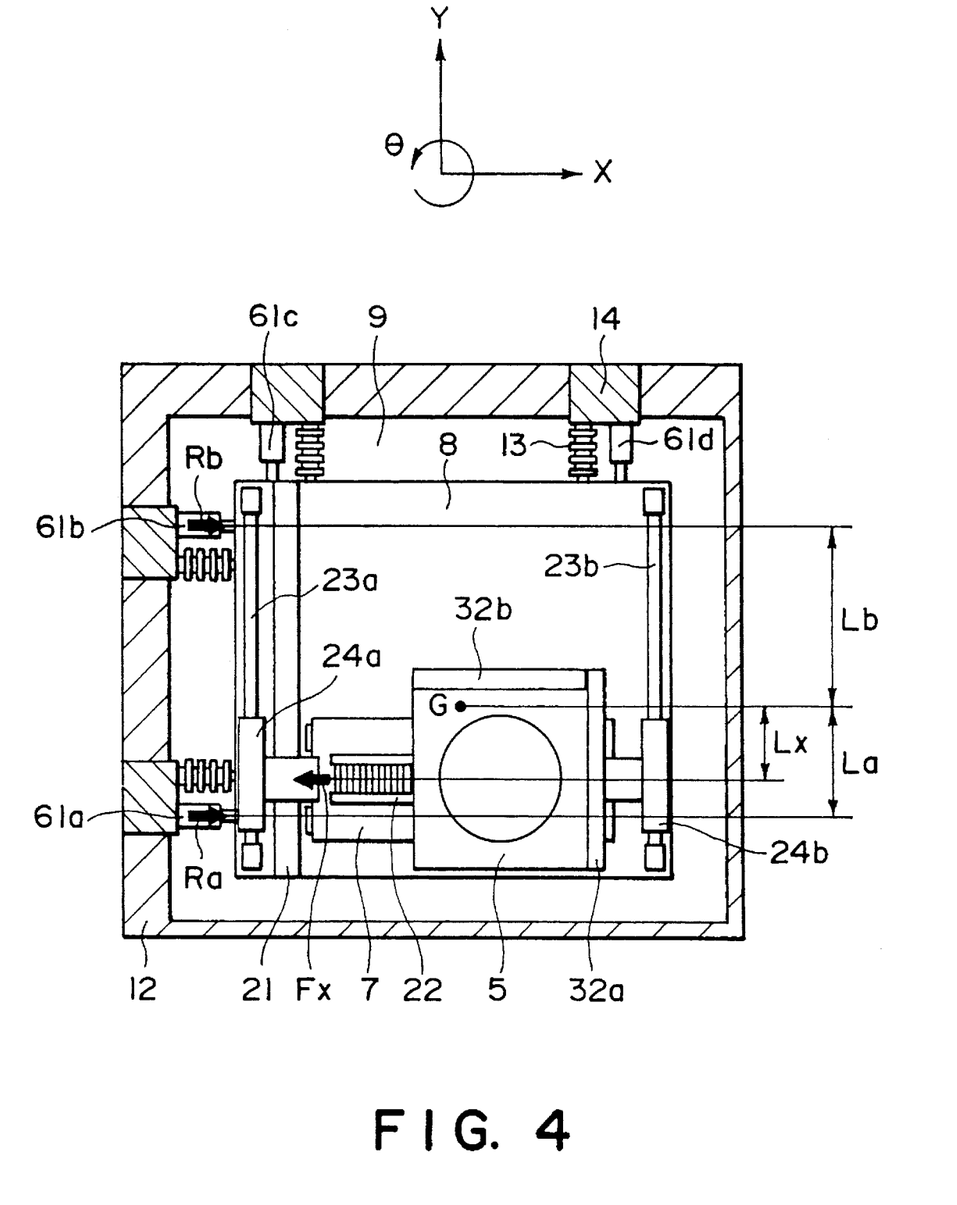
FIG. 4 is a top plan view of a wafer supporting stage in a second embodiment of the present invention.
Figure 5:
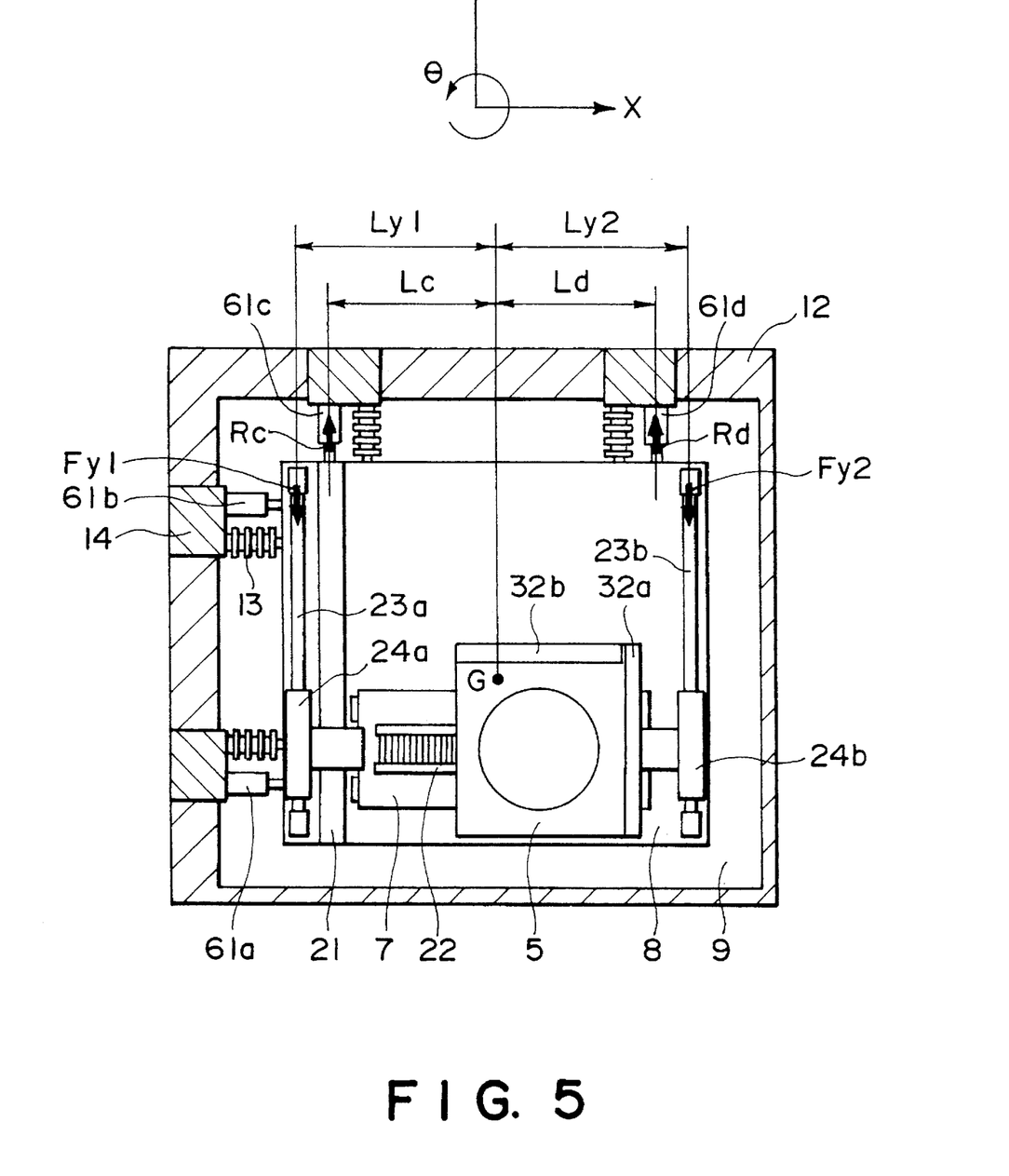
FIG. 5 is another top plan view of the wafer supporting stage in the second embodiment of the present invention.

FIGS. 4 and 5 are top plan views, respectively, illustrating a stage portion in a second embodiment of the present invention. In these drawings, reference numerals the same as those of the embodiment of FIGS. 1–3 are assigned to corresponding elements.

In FIGS. 4 and 5, denoted at 13 are air cushions provided at foist locations, for supporting the stage base 8 in the X, Y and θ directions. They are fixedly mounted to the base 12 through the coupling member 14. The air cushions 13 have minimized rigidity in the Z direction, such that they serve to isolate the stage base 8 from vibration of the base 12 in the Z direction. The rigidity of the air cushions 13 in the supporting directions (X, Y and θ directions) is adjusted so that intrinsic vibration related to the supporting directions of the stage base 8 becomes not greater than a few Hz. Denoted at 61a, 61b, 61c and 61d are voice coil type linear motors having stationary elements fixed to the coupling member 14 and having movable elements fixed to the stage base 8. These linear motors function to apply moments in the X, Y and θ directions to the stage base 8. They are connected to linear motor drivers through wires (not shown).

Figure 6:
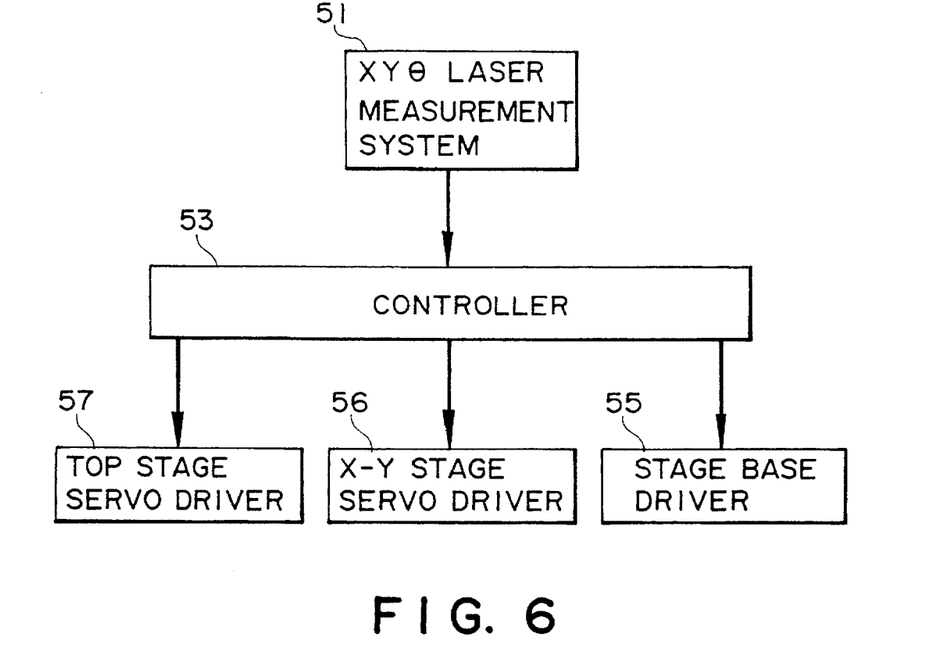
FIG. 6 is a block diagram for explaining a control system of the embodiment of FIGS. 4 and 5.

FIG. 6 is a block diagram of the control system of this embodiment. In this drawing, denoted at 51 is the X-Y-θ laser measurement system as illustrated in FIG. 3, and it serves to measure the position of the X-Y stage 6 on which the top stage 5 is mounted. Denoted at 53 is a controller for feed-back control of position signals of the X-Y stage 6 and of the top stage 5, and it serves to apply predetermined operation signals in relation to the respective driving axes. Denoted at 56 is a driver for supplying electric currents to the coils of linear motor stators 22, 23a and 23b of FIGS. 4 and 5 in response to the operation signal from the controller 53 to thereby drive the X-Y stage 6. Denoted at 55 is a driver for driving the linear motors 61a, 61b, 61c and 61d of FIGS. 4 and 5 in response to the operation signal from the controller 53. Denoted at 57 is a driver for driving the respective axes of the top stage 5.

In the structure described above, as the first embodiment, the X-Y stage 6 and the top stage 5 are moved to a predetermined position and, thereafter, the exposure operation is executed. After this, they are moved to the next position and the exposure operation is repeated. The controller 53 supplies an operation signal to the linear motor driver 56 so that the movement of the X-Y stage 6 follows a predetermined speed curve, and the movement of the stage 6 is accomplished as the linear motor produces a driving force in accordance with the supplied operation signal. The magnitude of the driving force is equal to the inertial force as determined by the mass of the X-Y stage 8 and the predetermined acceleration and deceleration speed, and the drive reactive force acts on the stage base 8. Here, the controller 53 supplies an operation signal to the linear motor driver 55 so as to cancel this drive reactive force, and the linear motors 61a, 61b, 61c and 61d produce forces which minimize the relative displacement of the stage base 8 relative to the main base 9.

For example, the operation signal may be determined as follows. In FIG. 4, in the case of x direction driving, it is now assumed that: the gravity center of the entire X-Y stage 6, the movable guide 7, the top stage 5 and the stage base 8 as determined by the masses and positions of these components is G; the drive reactive force is F; the forces produced by the linear motors 61a and 61b are $R_a$ and $R_b$; the distances to the gravity center G from the points of action of these forces are $L_x$, $L_a$ and $L_b$. The gravity center position and the distances $L_x$, $L_a$ and $L_b$ to the gravity center G from the points of action of these forces are determined from the stage position, and the produced forces $R_a$ and $R_b$ are determined in accordance with the force balance equation and the moment balance equation, taking the gravity center G as a reference, as follows:

$$R_a = -F_x x(L_x + L_b)/(L_a + L_b)$$

$$R_b = F_x x(L_x - L_a)/(L_a + L_b)$$

Also, as shown in FIG. 5, in the case of Y direction driving, assuming that the drive reactive forces are $F_{y1}$ and $F_{y2}$, the force produced by the linear motors 61c and 61d are $R_c$ and $R_d$, and the distances to the gravity center G from the points of action of these forces are $L_{y1}$, $L_{y2}$, $L_c$ and $L_d$, the produced forces $R_c$ and $R_d$ are given by the following equations:

$$R_c = -F_{y1}(L_{y1}+L_d)/(L_c+L_d) + F_{y2}(L_{y2}-L_d)/(L_c+L_d)$$

$$R_d = F_{y1}(L_{y1}-L_c)/(L_c+L_d) - F_{y2}(L_{y2}+L_c)/(L_c+L_d)$$

Namely, large drive reactive forces in the X, Y and Q directions acting on the stage base 9 during acceleration and deceleration are supported by the coupling member and the base 12 through the linear motors 61a, 61b, 61c and 61d, and they are not transmitted to the main base 9. Moment reactive forces in the α and β directions are supported by the main base 9 through the static air pads 10, but the magnitude thereof is very small as compared with those of the forces in the other directions.

Thus, intrinsic vibration of the mechanism systems of various components supported by the air mounts 11 is not excited, and no disturbance vibration is applied to the laser measurement system and the focus detecting system. While the supporting reactive force transmitted to the base 12 may cause excitement of intrinsic vibration of the coupling member 14 and the base 12, transmission of vibration to the main base 9 is blocked by the air mounts 11. Further, while the stage base 8 displaces in the X, Y and θ directions at a frequency of a few Hz relative to the main base 9, this is met by moving the X-Y stage 6 and the top stage 5.

As an important feature of this embodiment, in addition to the structure of the first embodiment, large reactive forces (in the X, Y and θ directions) to be transmitted to the stage base 8 due to inertial forces produced during acceleration and deceleration of the X-Y stage 6, are supported by the base 12 so that they are positively canceled by the linear motors, by which transmission of the reactive forces to the apparatus as a whole is intercepted. This enables, in combination with small supporting rigidity of the air cushions, enhancement of vibration removing ability for blocking transmission of vibration to the stage base 8 from the base 12.

While in this embodiment the air cushions 13 and the linear motors 61a–61d are disposed at four locations, substantially the same advantageous effect is attainable when such components are provided at three locations.

Also, detecting means for detecting the position and/or attitude of the stage base 8 with respect to X, Y and θ directions relative to the main base 9 may be provided, and the linear motors 61a–61d may be feedback controlled on the basis of the positional signal from the detecting means so as to keep the stage base 8 at a desired position.

Further, acceleration detecting means for detecting acceleration of vibration of the stage base 8 in the X, Y and θ directions may be provided, and the linear motors 61a–61d may be feedback controlled on the basis of the acceleration signal from the detecting means, to thereby suppress the vibration of the stage base 8.

Figure 7:
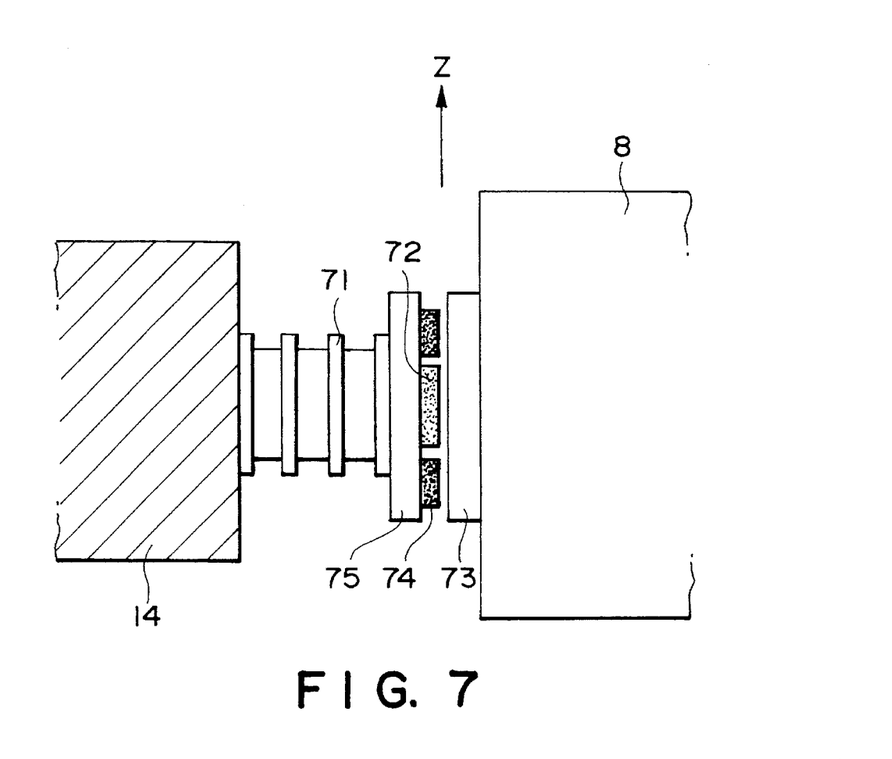
FIG. 7 is a fragmentary view for explaining details of a resilient supporting mechanism used in place of air cushion means in the apparatus of FIGS. 4 and 5.

FIG. 7 is a fragmentary view, showing a flexible or resilient supporting mechanism which may be used in place of the air cushions 13. Denoted in this drawing at 71 is a resilient member such as a coiled spring, for example, which is fixed to the coupling member 14. Denoted at 72 is a static air pad to which compressed air is supplied through piping, not shown. The air pad is mounted to the resilient member 71 through a mounting plate 75. Denoted at 73 is a guide member made of a magnetic material, having a guiding surface opposed to the static air pad 72. It is fixed to the stage base 8. Denoted at 74 is a permanent magnet for applying a preload to the static air pad 72. It is mounted to the mounting plate 75, and it serves to apply the attracting force to the guiding surface of the guide member 73. Thus, between the air pad 72 and the guide member 73, there is defined a static air bearing means of magnetic preload type.

The structure as described above allows to complete isolation of the stage base 8 from vibration in the Z direction of the mounting member 14 transmitted from the base 12.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

a projection optical system;

a stage for moving a substrate in a direction intersecting an optical axis of said projection optical system;

a first base for supporting said stage;

a main base for supporting said projection optical system;

static pressure bearing means for supporting, without contact, said first base relative to said main base with respect to a direction of the optical axis of said projection optical system;

a second base;

anti-vibration means for supporting said main base relative to said second base while isolating said main base from vibration of said second base; and supporting means for supporting said first base relative to said second base with respect to a direction intersecting the optical axis of said projection optical system, wherein any vibration of said first base in a direction intersecting the optical axis of said projection optical system and being attributable to movement of said stage is transmitted through said supporting to said second base.

2. An apparatus according to claim 1, further comprising a detector for measuring the position of the substrate on said stage with respect to one of (i) a direction intersecting the optical axis of said projection optical system and (ii) the direction of the optical axis of said projection optical system, wherein said detector is supported by said supporting means.

3. An apparatus according to claim 1, wherein said supporting means comprises a cushion member having a low rigidity with respect to the direction of the optical axis of said projection optical system, and a coupling member for coupling said cushion member with said second base.

4. An apparatus according to claim 3, wherein said cushion member comprises one of an air cushion and a resilient member.

5. An apparatus according to claim 3, wherein said cushion member comprises a combination of elements, each comprising said cushion member and said resilient member.

6. An apparatus according to claim 1, wherein said supporting means comprises a resilient member for resiliently supporting said first base.

7. An apparatus according to claim 6, wherein said supporting means comprises driving means for applying a drive force to said first base.

8. An apparatus according to claim 7, wherein said driving means cancels an inertial force of said first base in a direction intersecting the optical axis of said projection optical system and produced by movement of said stage.

9. An apparatus according to claim 8, wherein, upon movement of said stage, said driving means produces a drive force effective to reduce displacement of said first stage relative to said main base.

10. A method of manufacturing a device by use of an exposure apparatus as recited in any one of the preceding claims.

* * * * *

UNITED STATES PATENT AND TRADEMARK OFFICE
CERTIFICATE OF CORRECTION

PATENT NO.   : 5,610,686
DATED        : March 11, 1997
INVENTOR(S)  : EIJI OSANAI It is certified that error appears in the above-identified patent and that said Letters Patent is hereby corrected as shown below:

COLUMN 1

Line 21, "considered" should read --considered to--.

COLUMN 2

Line 9, "structure:" should read --structure;--.

COLUMN 3

Line 10, "To" should read --to--.

COLUMN 4

Line 6, "8" should read --a--.
    Line 23, "Of" should read --of--.
    Line 43, "ere" should read --are--.

COLUMN 5

Line 57, "Ks" should read --is--.

COLUMN 6

Line 11, "foist" should read --four--.

UNITED STATES PATENT AND TRADEMARK OFFICE
CERTIFICATE OF CORRECTION

PATENT NO. : 5,610,686  Page 2 of 2
DATED      : March 11, 1997
INVENTOR(S): EIJI OSANAI It is certified that error appears in the above-identified patent and that said Letters Patent is hereby corrected as shown below:

COLUMN 7

Line 11, "$R_b=F_x\times(L_x-L_a)/(L_a+L_b)\bullet$" should read --$R_b=F_x\times(L_x-L_a)/(L_a+L_b).$--.

Line 23, "$R_d=F_{y1}(L_{y1}-L_c)/(L_c+L_d)-F_{y2}(L_{y2}+L_c)/(L_c+L_d)\bullet$" should read --$R_d=F_{y1}(L_{y1}-L_c)/(L_c+L_d)-F_{y2}(L_{y2}+L_c)/(L_c+L_d).$--.

Signed and Sealed this

Twenty-third Day of September, 1997

Attest:

BRUCE LEHMAN

*Attesting Officer*    Commissioner of Patents and Trademarks